United States Patent
Chang et al.

(10) Patent No.: US 7,732,844 B2
(45) Date of Patent: Jun. 8, 2010

(54) CROSSTALK IMPROVEMENT THROUGH P ON N STRUCTURE FOR IMAGE SENSOR

(75) Inventors: Chung-Wei Chang, Hsin-Chu (TW); Han-Chi Liu, Shiang (TW); Chun-Yao Ko, Bade (TW); Shou-Gwo Wuu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 79 days.

(21) Appl. No.: 11/682,350

(22) Filed: Mar. 6, 2007

(65) Prior Publication Data

US 2008/0105944 A1    May 8, 2008

Related U.S. Application Data

(60) Provisional application No. 60/864,271, filed on Nov. 3, 2006.

(51) Int. Cl.
*H01L 31/062* (2006.01)
(52) U.S. Cl. .................. 257/292; 257/E27.133
(58) Field of Classification Search ......... 257/291–293, 257/443, 444, 446, E27.132, E27.133
See application file for complete search history.

(56) References Cited

U.S. PATENT DOCUMENTS

| 5,796,154 | A  | * | 8/1998 | Sano et al. | ................. | 257/432 |
| 6,171,885 | B1 | * | 1/2001 | Fan et al. | ................. | 438/70 |
| 6,608,337 | B2 | * | 8/2003 | Hynecek | ................. | 257/290 |
| 7,235,835 | B2 | * | 6/2007 | Nagano et al. | ................. | 257/296 |
| 7,391,455 | B2 | * | 6/2008 | Oda | ................. | 348/314 |
| 2006/0231898 | A1 | * | 10/2006 | Jeong et al. | ................. | 257/359 |

FOREIGN PATENT DOCUMENTS

JP    2003-224249    8/2003

OTHER PUBLICATIONS

Chinese Patent Office, Office Action of Nov. 7, 2008, Chinese Patent Application No. 2007101671709, 6 pages.

* cited by examiner

*Primary Examiner*—David Vu
(74) *Attorney, Agent, or Firm*—Haynes and Boone, LLP

(57) ABSTRACT

The present disclosure provides an image sensor semiconductor device. The semiconductor device includes a semiconductor substrate having a first type of dopant; a semiconductor layer having a second type of dopant different from the first type of dopant and disposed on the semiconductor substrate; and an image sensor formed in the semiconductor layer.

19 Claims, 3 Drawing Sheets

CROSSTALK IMPROVEMENT THROUGH P ON N STRUCTURE FOR IMAGE SENSOR

CROSS-REFERENCE

This application claims the benefit of U.S. Provisional Application 60/864,271 entitled "New Method Of Design For Manufacturing," filed Nov. 3, 2006.

BACKGROUND

In semiconductor technologies, image sensors are used for sensing a volume of exposed light projected towards the semiconductor substrate. Complementary metal-oxide-semiconductor (CMOS) image sensor devices are widely used in various applications such as digital still camera (DSC) applications. These devices utilize an array of active pixels or image sensor cells, including photodiode elements and MOS transistors, to collect photo energy to convert images to streams of digital data. However, image sensor devices suffer from electrical cross-talk.

For example, consider optical applications such as DSC, which require high-performance imaging with low electrical cross-talk, low noise, and superior optical performance. An image sensor including photodiodes and MOS transistors can be used in these applications. The photodiodes and MOS transistors can be formed in a P⁻ silicon semiconductor layer disposed on a P⁺ silicon substrate, and an incident light generates electron-hole pairs in the P⁻ silicon layer. The generated electrons outside depletion region will diffuse into neighboring photodiode and causes electrical cross-talk. The electrical cross-talk will degrade spatial resolution, reduce overall optical sensitivity and result in poor color separation. The electrical signal of light targeted for one image sensor element also may spread to other image sensors, which causes crosstalk. Improvements of the image sensor and/or the corresponding substrate are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
FIGS. 1-7 illustrate sectional views of embodiments of a semiconductor device having at least one image sensor element at various fabrication stages constructed according to aspects of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

An image sensor device and a method making the same will be described below with reference to FIGS. 1 to 7. Referring to FIG. 1, provided is a semiconductor device 100 having a semiconductor substrate 110 of a first type of dopant as illustrated. In the present embodiment, the semiconductor substrate 110 includes silicon. The substrate 110 may alternatively or additionally include other elementary semiconductor such as germanium. The substrate 110 may also include a compound semiconductor such as silicon carbide, gallium arsenic, indium arsenide, and indium phosphide. The first type of dopant is negative-type (N-type) dopants in one embodiment. The substrate 110 of the N-type dopants is doped by phosphorus or arsenic. The dopant concentration and resistivity is optimized so as to reduce impact to photodiode junction profile through bulk diffusion. The substrate 110 can be heavily doped or lightly doped. In one embodiment, the substrate 110 has a dopant concentration ranging from about $10^{14}$ to about $10^{20}$ cm$^{-3}$. The resistivity of the substrate 110 may range between about 0.002 and about 50 ohm-cm. The doping may be implemented using a process such as ion implantation or diffusion in various steps and techniques.

Figure 2:
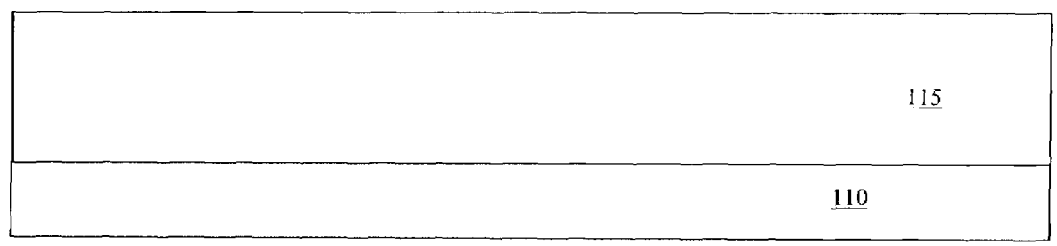

Referring to FIG. 2, a semiconductor layer 115 having a second type of dopant is formed on the semiconductor substrate 110, in which the second type of dopant is different from the first type of dopant. For example, when the substrate 110 is N-type doped, then the semiconductor layer is positive type (P-type). Boron or BF2 may be utilized to introduce P-type dopants. The semiconductor layer 115 may be also a silicon layer if the semiconductor substrate 110 is a silicon substrate. The semiconductor layer 115 may have a proper thickness and dopant concentration for better image sensor performance. The semiconductor layer 115 may have a thickness ranging between about 1 and about 20 micrometer. Preferably, the semiconductor layer 115 may have a thickness from about 1 to about 10 micrometer. More preferably, the semiconductor layer 115 may have a thickness from about 2 to about 8 micrometer. A semiconductor layer that is too thin is subject to degraded optical performance of a complementary metal-oxide-semiconductor (CMOS) image sensor or other sensor formed therein. The semiconductor layer 115 may have resistivity ranging from about 1 to about 50 ohm-cm, preferably about 8 to about 12 ohm-cm in one embodiment. The semiconductor layer 115 may have a dopant concentration ranging from about $10^{14}$ to about $10^{16}$ cm$^{-3}$. The semiconductor layer 115 may be formed by an epitaxy growth of a layer of crystalline silicon on the silicon substrate or other semiconductor material. In one embodiment, the epitaxy growth of the silicon layer may be implemented by utilizing a silane (SiH$_4$) gas. In furtherance of the embodiment, the silane gas has a temperature about 1000° C. and gas pressure ranging between about 40 and about 760 Torr. The epitaxy growth may further utilize another gas (or gases) with a proper pressure to introduce dopants.

Alternatively, the semiconductor layer 115 may be formed by applying an ion implantation process to the semiconductor substrate 110 with a proper dose and energy to form a reverse doped semiconductor layer from the semiconductor substrate 110.

Since the semiconductor layer 115 has a reverse type of dopant from the dopants of the semiconductor substrate 110, minority diffusion is reduced during applications. Furthermore, the semiconductor substrate is designed operable to have a voltage bias applied thereon during applications. For example, a positive voltage such as $V_{dd}$ may be applied to the N-type semiconductor substrate 110 through a guard ring formed in the substrate. The voltage bias will generate a depletion region having an electrical field between the N-type substrate and the P-type semiconductor layer. The electrical field will attract electrons moving downward to the substrate and prevent electrons diffusing into neighboring image sensors (such as photodiodes). The electrical cross-talk is thus greatly reduced.

Figure 3:
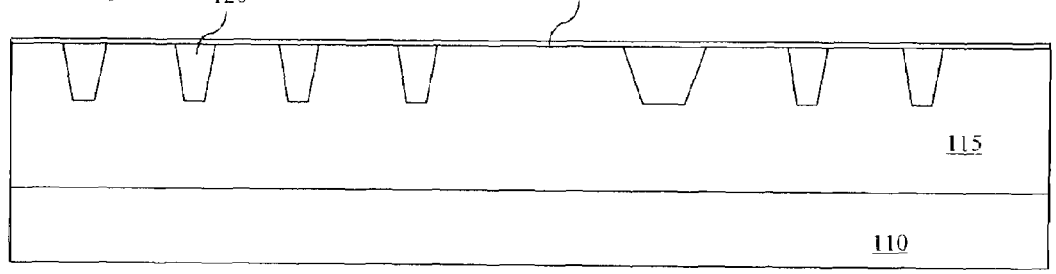

Referring to FIG. 3, a plurality of isolation features 120 such as shallow trench isolation (STI) are formed in the semiconductor layer 115 to define various regions for making image sensor elements and various transistors. In one example, the image sensor elements include photodiodes. The shallow trench isolation features 120 may be formed by a suitable technique known in the art. For example, the STI features may be formed by a set of processes including patterning the semiconductor layer by a conventional photolithography, etching the semiconductor layer by a plasma etching process to form various trenches, and filling the trenches by a dielectric material such as silicon oxide by a chemical vapor deposition (CVD) process. The CVD process may utilize a high density plasma CVD (HDPCVD) to achieve a better planar surface of the STI features. Additionally, a sacrificial layer 125 may be formed on the semiconductor layer 115 for subsequent processes. The sacrificial layer 125 may have a thickness more than about 100 angstrom and may include a silicon oxide layer thermally grown on the silicon semiconductor layer.

Figure 4:
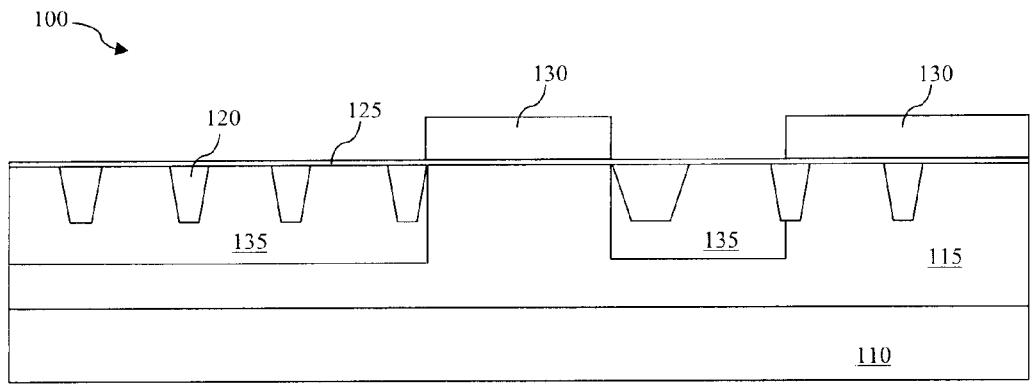

Referring to FIG. 4, a P-type well (P-well) 135 is formed in the semiconductor layer of the P-type of dopant. The formation of the P-well may implement forming a patterned photoresist layer 130 on the sacrificial layer 125 and performing an ion implantation process to the semiconductor layer through the exposed sacrificial layer 125 within the openings of the patterned photoresist layer 130. The ion implantation process may utilize boron as doping impurity, and further utilize an implantation energy ranging between about 100 and about 200 KeV, and implantation dose ranging between $10^{13}$ and $3 \times 10^{13}$ cm$^{-2}$. The P-well 135 has a depth from about 0.5 micrometer to about 1 micrometer in one embodiment.

Figure 5:
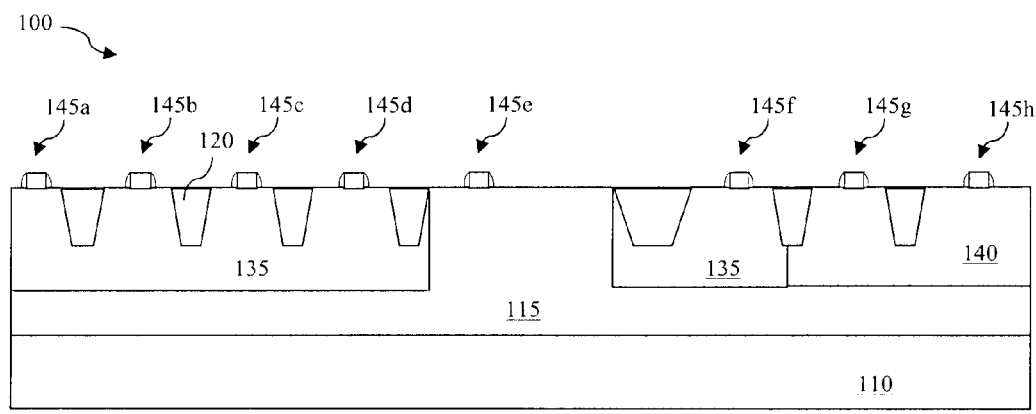

Referring to FIG. 5, various transistors 145 are formed in the P-well 135 after removing the patterned photoresist layer 130 by wet stripping or plasma ashing. The various transistors may include a transfer gate transistor, a reset gate transistor, a source follower, a row select transistor, and may further include other MOS transistors such as N-type MOS (NMOS) transistors. The NMOS may include NMOS transistor designed operable under different electrical voltages. In one example, a group of NMOS transistors are designed for 3.3V operation and another group of NMOS transistors are designed for 1.8V operation. Each transistor may include a source, a drain and a gate, wherein the gate further include a gate dielectric and a gate electrode. Furthermore, a N-well 140 may be formed in the semiconductor layer 115. approximate to the P-well 135. Various p-type MOS (PMOS) transistors may be formed in the N-well 140. The sacrificial layer 125 can be removed during the formation of the various NMOS and PMOS transistors. In one embodiment, transistor 145a is an exemplary 3.3V NMOS transistor, 145b a row select transistor, 145c a source follower transistor, 145d a reset gate transistor, 145e a transfer gate transistor, 145f an 1.8V NMOS transistor, 145g an 1.8V PMOS transistor, and 145h a 3.3V PMOS transistor.

Figure 6:
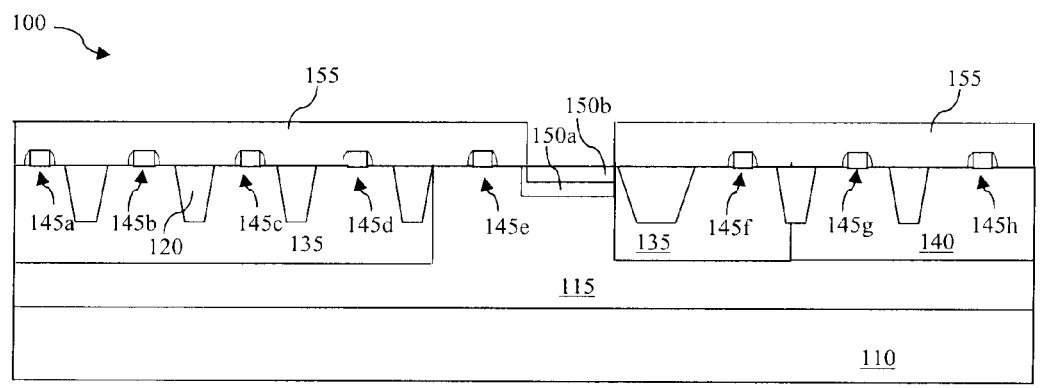

Referring to FIG. 6, an n-type photodiode 150 is formed in the p-type semiconductor layer 115. The n-type impurity such as phosphorus or arsenic can be introduced into the semiconductor layer using an ion implantation process to form n-type doped region 150a. In one example for 0.18 micrometer technology node, the implant energy ranges from about 50 to about 500 KeV, and the implant dose ranges from about $10^{12}$ to about $10^{13}$ cm$^{-2}$. The n-type photodiode 150 has a depth from about 0.05 micrometer to about 0.1 micrometer in one example. A p-type doped region 150b, also referred to as a p-type pinned layer, is formed in the photodiode 150 using p-type impurity such as boron or $BF_2$. The pinned layer helps to achieve better optical performance such as low leakage current. The implant energy for the pinned layer ranges from about 10 to about 100 KeV, and the implant dose ranges from about $10^{13}$ to about $10^{14}$ cm$^{-2}$. The pinned layer may have a thickness ranging from about 0.02 micrometer to about 0.05 micrometer. Alternatively, the photodiode 150 may be formed in a second P-well having a dopant concentration less than that of the P-well 135 and formed separately.

Figure 7:
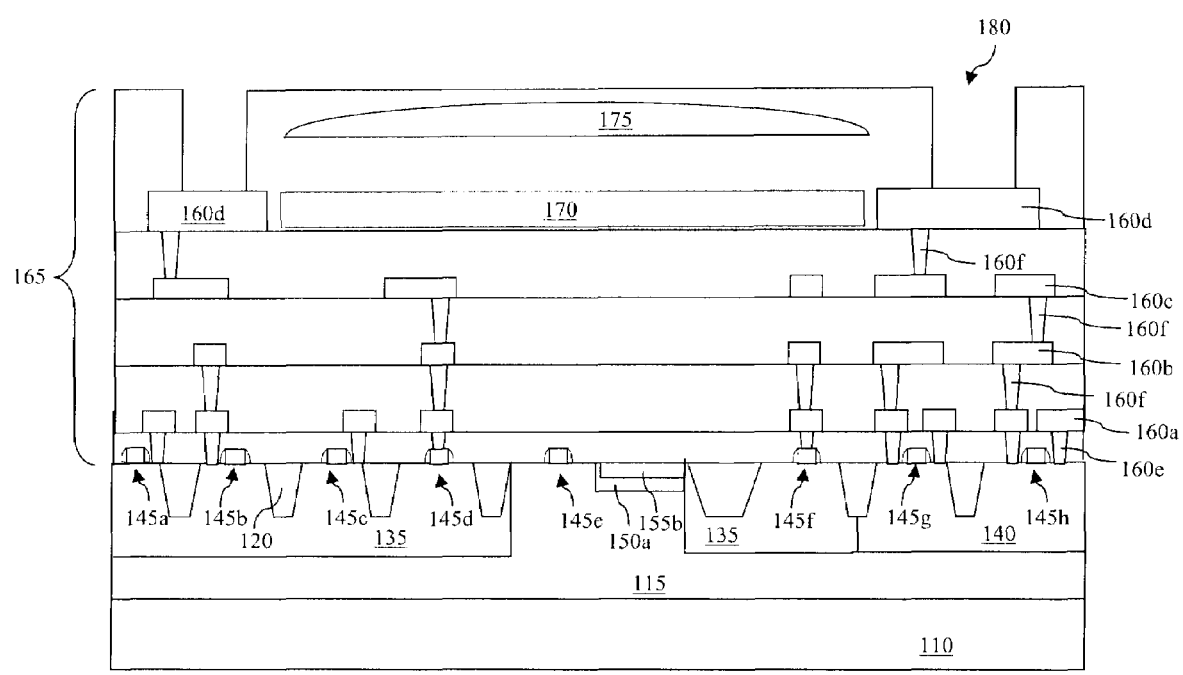

Referring to FIG. 7, other features such as a multi-layer interconnect (MLI) structure 160 and a dielectric layer 165 separating the MLI structure are formed on the semiconductor layer 115. In one example, the MLI structure 160 includes exemplary metal layer one 160a, metal layer two 160b, metal layer three 160c, and top metal 160d. The MLI structure 160 further includes a contact 160e to connect the various features on the semiconductor layer and the metal layer one. The MLI structure 160 further includes a via 160f to connect between metal layers. The dielectric layer 165 is formed within the MLI structure and may include multiple layers such as inter-level dielectric and inter-metal dielectric.

The multilayer interconnect may include conductive materials such as aluminum, aluminum/silicon/copper alloy, titanium, titanium nitride, tungsten, polysilicon, metal silicide, or combinations, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical (via and contact) and horizontal connects (conductive line). Still other manufacturing processes such as thermal annealing may be used to form metal silicide. Alternatively, a copper multilayer interconnect may be used and include copper, copper alloy, titanium, titanium nitride, tantalum, tantalum nitride, tungsten, polysilicon, metal silicide, or combinations. The copper multilayer interconnect may be formed by a technique such as CVD, sputtering, plating, or other suitable processes. The metal silicide used in multilayer interconnects may include nickel silicide, cobalt silicide, tungsten silicide, tantalum silicide, titanium silicide, platinum silicide, erbium silicide, palladium silicide, or combinations thereof.

The dielectric layer is configured to isolate the multilayer interconnect disposed therein. The dielectric layer can be a material of a low dielectric constant such as a dielectric constant less than about 3.5. The dielectric layer may include silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The dielectric layer may be formed by a technique including spin-on, CVD, sputtering, or other suitable processes. The MLI and dielectric layer may be formed in an integrated process such as a damascene process or lithography/plasma etching process.

A color filter 170 and a microlens 175 may also be formed on the substrate and are properly configured operable to collect optical light and filter there through, respectively and direct the light to the photodiode 150. Openings 180 may be further formed to expose the top metal layer for bonding pads to be formed therein.

The image sensor device 100 and the method of making the same may have other embodiments, alternatives, and variations. For example, the above provided embodiment includes an n-type semiconductor substrate, a p-type semiconductor layer, and various wells, transistors, and photodiodes of certain doping types and profiles accordingly. In an alternative embodiment, a p-type semiconductor substrate and an n-type semiconductor layer may be used. All other doping type may be reversed accordingly for proper configuration and functionality. Furthermore, the substrate may be electrically biased to a negative voltage to generate a depletion region during applications.

Examples of image sensor 150 may alternatively include charged coupling device (CCD) sensors, active sensor, passive sensor, and/or other devices diffused or otherwise formed in the substrate 110. As such, the sensor elements 150 may comprise conventional and/or future-developed image sensing devices. The semiconductor device 100 may include a plurality of sensor elements disposed in an array or other proper configuration. The plurality of sensor elements may be designed to have various sensor types. For example, one group of sensor elements may be CMOS image sensors and another group of sensor elements may be passive sensors. Moreover, the sensor elements may include color image sensors and/or monochromatic image sensors.

In the disclosed structures and the methods to make the same, the illuminated light that the device 100 or 200 to be receive during applications may not be limited to visual light beam, but can be extended to other optical light such as infrared (IR) and ultraviolet (UV), and other proper radiation beam. Accordingly, the sensor element and various transistors may be properly designed and configured for effectively reflecting and/or absorbing the corresponding radiation beam. The semiconductor device 100 may include a passivation layer disposed over the MLI.

Thus, the present disclosure provides an image sensor semiconductor device. The semiconductor device includes a semiconductor substrate having a first type of dopant; a semiconductor layer having a second type of dopant different from the first type of dopant and disposed on the semiconductor substrate; and an image sensor formed in the semiconductor layer.

In the image sensor semiconductor device, the semiconductor layer include a thickness ranging between about 1 and about 20 micrometer. Preferably, the thickness of the semiconductor layer may range between about 1 and about 10 micrometer. More preferably, the thickness of the semiconductor layer may range between about 2 and about 8 micrometer. The image sensor may further include a first doped region of the first type of dopant formed in the semiconductor layer; and a second doped region of the second type of dopant formed in the semiconductor layer and overlying the first doped region. The semiconductor device may further include various microelectronic units formed in the semiconductor layer, wherein the various microelectronic units include one selected from the group consisting of a transfer gate transistor, a reset gate transistor, a source follower transistor, a row select transistor, a N-type metal-oxide-semiconductor transistor (NMOS), a P-type metal-oxide-semiconductor transistor (PMOS), and combinations thereof. The various microelectronic units may be isolated from each other by shallow trench isolation (STI) features. The semiconductor substrate may be operable to be electrically biased to prevent crosstalk during applications. The semiconductor layer may be formed by implementing one method selected from the group consisting of epitaxy growth, ion implantation, and combinations thereof. The semiconductor layer may include a resistivity ranging from about 1 to about 50 ohm-cm. The semiconductor layer may include a doping concentration ranging between about $10^{14}$ and about $10^{16}$ $cm^{-3}$. The semiconductor substrate may have a resistivity ranging from about 0.002 to about 50 ohm-cm. The semiconductor substrate may include a doping concentration ranging between about $10^{14}$ and about $10^{20}$ $cm^{-3}$. In the image sensor semiconductor device, one of the first type of dopant and the second type of dopant is negative-type and another is positive-type. The semiconductor device may further include a color filter configured on the semiconductor layer overlying the image sensor and substantially vertically aligned thereto, and may further include a microlens disposed on the semiconductor layer overlying the color filter and substantially vertically aligned to the image sensor.

In another embodiment, the present disclosure provides an image sensor semiconductor device, which includes a semiconductor substrate having a first type of dopant and operable to be electrically biased during applications; a semiconductor layer having a second type of dopant different from the first type of dopant and disposed on the semiconductor substrate; and a photodiode formed in the semiconductor layer, wherein the photodiode includes a first doped region having the first type of dopant; and a second doped region overlying the first doped region and having the second type of dopant.

In the semiconductor device, the semiconductor substrate may be light doped with the first type of dopant. The semiconductor substrate may be alternatively heavily doped with the first type of dopant. The first doped region may be a N-type region and the second doped region is a P-type pinned layer. The semiconductor layer may include a thickness ranging between about 2 and about 8 micrometer and the photodiode may include a depth ranging from about 0.05 micrometer to about 0.1 micrometer. The semiconductor layer may include a thickness ranging between about 2 and about 8 micrometer and the second doped region may include a depth ranging from about 0.02 micrometer to about 0.05 micrometer.

The present disclosure also provides a method for fabricating an image sensor semiconductor device. The method includes providing a silicon substrate having a first type of dopant; forming, on the silicon substrate, a silicon layer of a second type of dopant different from the first type of dopant; forming various wells and microelectronic units therein; and forming an image sensor in the silicon layer.

The method may further include forming a multi-layer interconnect (MLI) structure on the semiconductor layer; forming a color filter disposed on the MLI structure and vertically aligned with the image sensor; and forming a microlens disposed overlying the color filter and vertically aligned with the image sensor. The forming of the semiconductor layer may include forming an epitaxy semiconductor layer of the second type of dopant. The forming of the semiconductor layer may include implementing an epitaxy growth with a silane gas of a pressure ranging between about 40 and about 760 Torr and a growth temperature about 1000° C. The forming of the semiconductor layer may alternatively include implementing an ion implantation process utilizing the second type of dopant. The forming of the silicon layer may include forming a silicon layer of a thickness ranging from about 1 micrometer to about 20 micrometer. The forming of the image sensor may include forming a photodiode in the silicon layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a semiconductor substrate of a first-type dopant;
   a semiconductor layer of a second-type dopant and directly on the semiconductor substrate, wherein the second-type dopant is opposite to the first-type dopant;
   a first and a second wells of the second-type dopant and a first depth, spaced horizontally a distance from each other, formed in a top portion of the semiconductor layer, defining a region of the semiconductor layer horizontally interposed between the first and second wells; and
   a photo-sensitive structure in the region of the semiconductor layer, including:
      a first doped layer of the first-type dopant and a second depth, the first doped layer contacting the semiconductor layer of the second-type dopant; and
      a second doped layer of the second-type dopant and a third depth, the second doped layer directly contacting the second well on a first side, and directly contacting the first doped layer on a second side and third side,
   wherein the first depth is greater than the second depth and the second depth is greater than the third depth.

2. The device of claim 1,
   further comprising a third well of the second-type dopant, interposed between the first and second well, wherein third well has a doping concentration less than that of the first and second wells, and the photo-sensitive structure is disposed in the third well.

3. The device of claim 1, further comprising a guard ring formed in the silicon substrate and designed operable to be electrically biased to prevent crosstalk during applications.

4. The device of claim 1, wherein the semiconductor layer comprises a resistivity ranging from about 1 to about 50 ohm-cm.

5. The device of claim 1, wherein the semiconductor layer comprises a doping concentration ranging between about $10^{14}$ and about $10^{16}$ cm$^3$.

6. The device of claim 1, wherein the semiconductor substrate comprises a resistivity ranging from about 0.002 to about 50 ohm-cm.

7. The device of claim 1, wherein the semiconductor substrate comprises a doping concentration ranging between about $10^{14}$ and about $10^{14}$ and about $10^{20}$ cm$^{-3}$.

8. The device of claim 1, further comprising a color filter configured on the semiconductor layer overlying the photo-sensitive structure and substantially vertically aligned thereto.

9. The device of claim 8, further comprising a microlens disposed on the semiconductor layer overlying the color filter and substantially vertically aligned to the image sensor.

10. The device of claim 1, wherein the semiconductor substrate is light doped with the first type of dopant.

11. The device of claim 1, wherein the semiconductor substrate is heavily doped with the first type of dopant.

12. The device of claim 1, wherein the first doped region is a N-type region and the second doped region is a P-type pinned layer.

13. The semiconductor device of claim 1, further comprising a shallow trench isolation (STI) embedded in one of the first and second wells.

14. The semiconductor device of claim 1, further comprising a first transistor and a second transistor formed in the first well, wherein the first transistor and the second transistor are structured differently such that the first transistor is operable for a first operation voltage and the second transistor is operable for a second operation voltage less than the first operation voltage.

15. A semiconductor device, comprising:
   a semiconductor substrate of a first-type dopant;
   a semiconductor layer of a second-type dopant and directly on the semiconductor substrate, wherein the second-type dopant is opposite to the first-type dopant;
   a first well of the second-type dopant, having a first doping concentration and formed in the semiconductor layer;
   a second and a third wells of the second-type dopant, having a second doping concentration greater than the first doping concentration, disposed in the semiconductor layer and interposed by the first well;
   a photo-sensitive structure in the first well region, wherein the photo-sensitive structure directly contacts the second well from a first side and further includes:
      a first doped layer of the first-type dopant; and
      a second doped layer of the second-type dopant, the second doped layer being overlying the first doping layer;
   an isolation structure positioned in the first well region and directly adjacent the first side of the photo-sensitive structure; and
   a device having an electrode positioned above and coupled with the semiconductor layer of the second-type dopant and adjacent a second side of the photo-sensitive structure opposite of the first side.

16. The device of claim 15, further comprising various microelectronic units formed in the semiconductor layer, wherein the various microelectronic units include one selected from the group consisting of a transfer gate transistor, a reset gate transistor, a source follower transistor, a row select transistor, a N-type metal-oxide-semiconductor transistor (NMOS), a P-type metal-oxide-semiconductor transistor (PMOS), and combinations thereof.

17. The device of claim 16 wherein the various microelectronic units are isolated from each other by shallow trench isolation (STI) features embedded in doped wells.

18. The device of claim 15, wherein the semiconductor layer includes a thickness ranging between about 2 and about 8 micrometer and the photo-sensitive structure includes a depth ranging from about 0.05 micrometer to about 0.1 micrometer.

19. The device of claim 15, wherein the semiconductor layer includes a thickness ranging between about 2 and about 8 micrometer and the second doped region includes a depth ranging from about 0.02 micrometer to about 0.05 micrometer.

* * * * *